US005696357A

United States Patent [19]

Starobin

[11] Patent Number: 5,696,357

[45] Date of Patent: Dec. 9, 1997

[54] BASS-REFLEX LOUDSPEAKER

[75] Inventor: Bradely M. Starobin, Pikesville, Md.

[73] Assignee: Polk Investment Corporation, Wilmington, Del.

[21] Appl. No.: 519,365

[22] Filed: Aug. 25, 1995

[51] Int. Cl.[6] ..................... H05K 5/00

[52] U.S. Cl. ..................... 181/156; 181/199

[58] Field of Search ..................... 181/148, 156, 181/199; 381/154, 159

[56] References Cited

U.S. PATENT DOCUMENTS

| | | | |
|---|---|---|---|
| 3,142,353 | 7/1964 | Todisco | 181/156 |
| 4,201,274 | 5/1980 | Carlton | 181/156 |
| 4,284,166 | 8/1981 | Gale | 181/156 |
| 5,115,473 | 5/1992 | Yamagishi et al. | 181/156 X |

FOREIGN PATENT DOCUMENTS

| | | |
|---|---|---|
| 0 480 087 A1 | 4/1992 | European Pat. Off. . |
| 0 612 194 A1 | 8/1994 | European Pat. Off. . |
| 0 641 142 A1 | 3/1995 | European Pat. Off. . |
| 2 534 437 | 4/1984 | France . |
| 4159898 | 9/1992 | Japan . |

*Primary Examiner*—Khanh Dang
*Attorney, Agent, or Firm*—Snell & Wilmer

[57] ABSTRACT

A bass-reflex loudspeaker system includes a number of ports configured to reduce acoustic depth mode re-radiation associated with the loudspeaker cabinet during use. The length of a first port is dependent upon the interior depth of the loudspeaker cabinet and the first port is configured such that the half-wavelength resonance of the first port coincides with the half-wavelength depth mode resonance of the loudspeaker cabinet. The length of a second port is less than the length of the first port and the cross sectional area of the first port is approximately equal to the cross sectional area of the second port.

11 Claims, 4 Drawing Sheets

BASS-REFLEX LOUDSPEAKER

TECHNICAL FIELD OF THE INVENTION

This invention relates generally to loudspeaker systems, and more particularly to an improved bass-reflex loudspeaker incorporating a method and apparatus for the active suppression of acoustic modal re-radiation.

BACKGROUND OF THE INVENTION AND PRIOR ART

Bass-reflex loudspeaker systems have been popular for at least fifty years as a means of obtaining greater low frequency efficiency from a given enclosure volume. While the advent of personal computers has enhanced the ability to optimize vented loudspeaker system designs, practical considerations often impede or prevent actual construction of optimized loudspeaker system designs. In general, a bass-reflex (BR) loudspeaker system incorporates a tuned aperture which is utilized to improve the low frequency performance over an otherwise comparative sealed box system. As will be appreciated, typically the tuned aperture comprises a vent of a prescribed cross-sectional area and length which defines the mass or "slug" of air which resonates with the air stiffness associated with the "air spring" enclosed by the cabinet. Through the appropriate combination of transducer parameters, cabinet volume and vent dimensions, a system can be implemented in which the low frequency performance of the system is greatly supplemented by the sound radiation associated with the vent resonance.

Even a properly tuned bass-reflex or conventional sealed loudspeaker may, however, exhibit performance aberrations due to internal acoustic resonances. In particular, the internal box resonance can contribute to the sound by re-radiation of the energy. More particularly, these modes, excited by the "back-wave" energy of the cone woofers, resonate at frequencies governed by the internal dimensions of the enclosure. As will be appreciated, rectangular enclosures having relatively long dimensions typically give rise to relatively low frequency modes. In general, these modes are controlled through acoustic damping by the provision of conventional passive means. For example, the appropriate placement of suitable materials inside the enclosure such as long fiber dacron, fiberglass or open cell foams serve to reduce the performance effects of internal box modes above or about 2.0 kHz. With enclosures having relatively long dimensions, however, the relatively low frequency modes which are produced cannot be adequately controlled by these conventional means.

With reference to FIG. 1, a conventional bass-reflex type speaker system is shown. In this system, an aperture is formed in the front surface of a cabinet 10 and a vibrator comprising a diaphragm 12 and an electromagnetic element 14 is mounted over the opening. An open duct or port 16 having a sound path 18 is arranged below the vibrator and also formed in an opening of cabinet 10. As is known, in such a system, the resonance associated with the airspring of cabinet 10 and the air mass in the sound path 18 of port 16 is optimally selected to occur at a frequency to be the same as or lower than the resonance frequency of the vibrator. As a result, the low frequency performance can be enhanced.

The mechanism for "re-radiation" of the acoustic energy associated with depth mode excitation is also shown in FIG. 1. The high pressure surfaces (denoted in FIG. 1 with a "+" symbol) corresponding to this resonance are the front baffle and the back of cabinet 10. Since the underside of diaphragm 12 is approximately co-planar with the rear surface of the baffle, oscillatory forces associated with high modal pressures are exerted on diaphragm 12, causing it to undergo oscillatory translational motion along its axis of symmetry. The net motion of diaphragm 12 is thus the superposition of contributions attributable to both the electro-mechanical forces associated with the electric current flowing through the vibrator and the pure mechanical forces attributable to the net pressure acting on the vibrator. When program material features sustained tones within the modal bandwidth of the cabinet's depth mode (e.g., the frequency range within which the mode is excited), these forces act in concert to simultaneously push and pull opposing sides of the diaphragm, thus giving rise to excessive cone displacement. While negative pressures (denoted in FIG. 1 by the "–" symbol) on one side of the diaphragm effectively pull on it, positive pressures push from the other side, thus tending to exaggerate cone motion near the cabinet half-wavelength resonance. In addition, transient forces also will excite half-wavelength cabinet depth mode. As a result, oscillatory forces exerted on the rear surface of the diaphragm tend to give rise to the re-radiation of that energy and an associated coloration of the sound.

These modes tend to exist at relatively low frequencies (particularly for practically sized loudspeakers) and thus these modes cannot be adequately suppressed via passive dissipative materials. Moreover, these depth mode colorations are evidenced by a peak in the system acoustic response near the half-wavelength frequency associated with the internal cabinet depth. Subjectively, these are perceived as exaggerated "chestiness" or "honking" of male voices (500–800 Hz) or excessive congestion (perceived as a lack of mid-range openness (800–1200 Hz). In general, the lack of mid-range clarity, especially apparent when program material features naturally recorded vocals, is the signature of this performance aberration.

The present invention addresses this disadvantage of conventional bass-reflex and other conventional loudspeakers and provides a method and apparatus for suppression of acoustic modal re-radiation.

SUMMARY OF THE INVENTION

It is an object of the present invention to provide a bass-reflex loudspeaker incorporating a method and apparatus for the active suppression of acoustic modal re-radiation.

Briefly, in accordance with one embodiment of the invention, additional suitably sized ports are provided mounted to the front baffle of a loudspeaker cabinet. Through appropriate placement of the additional port or ports, driver re-radiation and resonance associated with the half-wavelength acoustic depth mode of the loudspeaker cabinet are eliminated. Resonant vent radiation from the additional port or ports destructively interferes with driver re-radiation, thereby improving mid-range clarity of the system.

BRIEF DESCRIPTION OF THE DRAWING

A preferred exemplary embodiment of the present invention will be hereinafter described in conjunction with the appended drawing figures, wherein like designations denote like elements, and.

DETAILED DESCRIPTION OF PREFERRED EXEMPLARY EMBODIMENTS OF THE PRESENT INVENTION

The subject matter of the present invention is particularly well suited for use in connection with bass-reflex loudspeakers, particularly those which are often referred to as "bookshelf size" or "bookshelf" speakers. It should be appreciated, however, that such description is not intended as a limitation on the use or applicability of the subject invention, but rather is set forth to merely fully describe a preferred exemplary embodiment thereof. Throughout this specification terms such as "approximately" or "substantially" may be used to describe measurable physical quantities. Those skilled in the art will recognize that such terms may be used to anticipate the practical uncertainties inherent in manufacturing processes, assembly techniques, and/or measurement equipment. Those skilled in the art will be familiar with various manufacturing and measurement tolerances acceptable in the field of the present invention.

While the way in which the present invention addresses the disadvantages of prior art configurations will be described in greater detail herein, in general, appropriate placement of suitably sized ports function to effectively eliminate driver re-radiation and resonance associated with the half-wavelength acoustic depth mode of the speaker cabinet. More particularly, through appropriate placement of the ports, as will be described herein, the resonant vent radiation destructively interferes with driver re-radiation thereby improving the mid-range clarity of bass-reflex loudspeakers. Excitation of the port's coincident half-wavelength "organ pipe" mode also serves to acoustically dissipate some of the resonant energy associated with the cabinet's depth mode resonance, effectively reducing re-radiation by reducing the level of the mechanical oscillatory forces that are exerted on the rear surface of the driver diaphragm.

Figure 2:
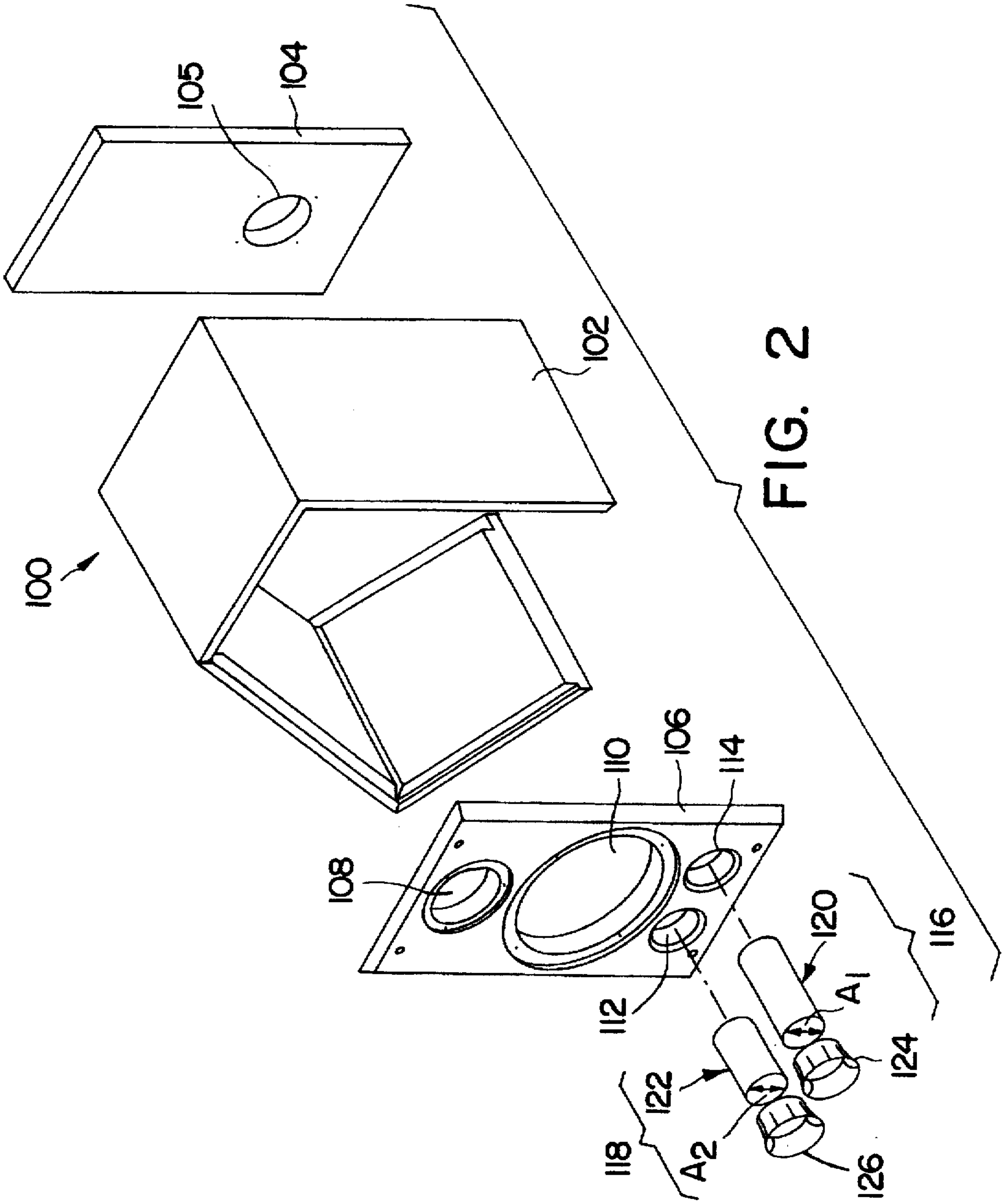
FIG. 2 is an exploded perspective view of the components of a bass-reflex loudspeaker in accordance with the present invention.
Figure 1:
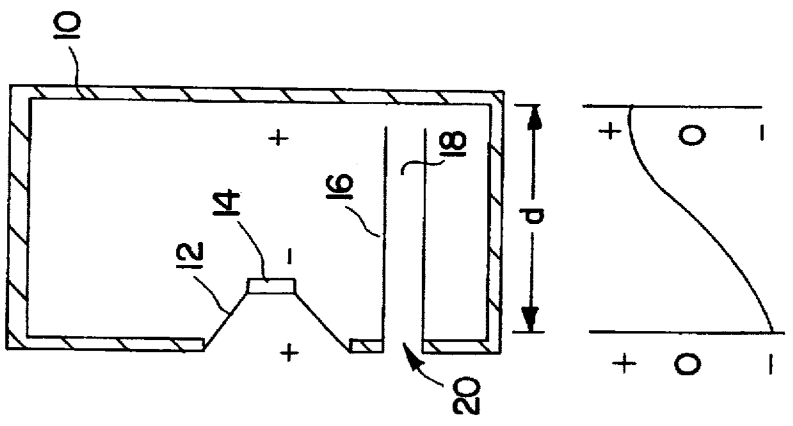
FIG. 1 (PRIOR ART)
FIG. 1 is a cross-sectional view of a prior art bass-reflex type speaker.

With reference to FIG. 2, a preferred embodiment of the present invention comprises a bass-reflex loudspeaker system 100. System 100 suitably comprises a cabinet 102 to which a rear baffle 104 and a front baffle 106 are suitably attached. Rear baffle 104 is suitably provided with an aperture 105 for attachment of a terminal cup (not shown) of a conventional configuration and in a conventional manner.

Front baffle 106 is suitably provided with respective apertures 108 and 110 which are appropriately configured to receive conventional driver elements for example, tweeter and woofer assemblies or subassemblies (both not shown). As will be appreciated, tweeter and woofer subassemblies are of a conventional design and configuration and are attached to front baffle 106 in a conventional manner.

In accordance with a preferred aspect of the present invention, front baffle 106 is also provided with respective apertures 112, 114 which are suitably sized to receive respective port assemblies 116 and 118. As will be discussed more fully hereinbelow, ports 116 and 118 are suitably used in accordance with the present invention to effectively limit and ultimately cancel the half-wavelength depth mode of cabinet 102 when speaker 100 is in use.

With continued reference to FIG. 2, ports 116 and 118 suitably comprise a two part construction including respective cylindrical tubes 120, 122 and respective port flares 124, 126. As shown in FIG. 2, flares 124, 126 exhibit a generally expanding cross-section from rear to front so as to permit press fitting of ports 116, 118 into apertures 114, 112 of baffle 106. While such two ports have been found to be able to be advantageously employed in the context of the speaker system in accordance with the present invention, it should be appreciated that other port configurations, designs or modifications in the design shown can be made in the context of the present invention.

Cylinders 120, 122 can be formed of any conventional material; preferably, tubes 120, 122 are formed of cardboard. However, other materials such as molded plastics and the like may also be employed.

Figure 3A:
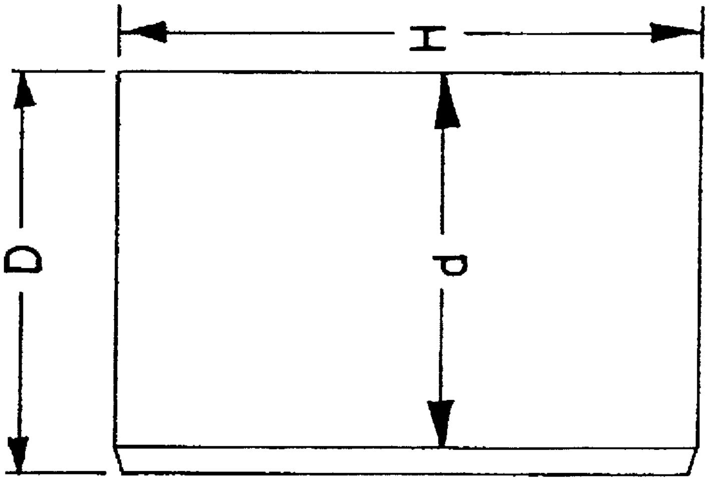
FIG. 3A is a side view of the speaker shown in FIG. 3.
Figure 3:
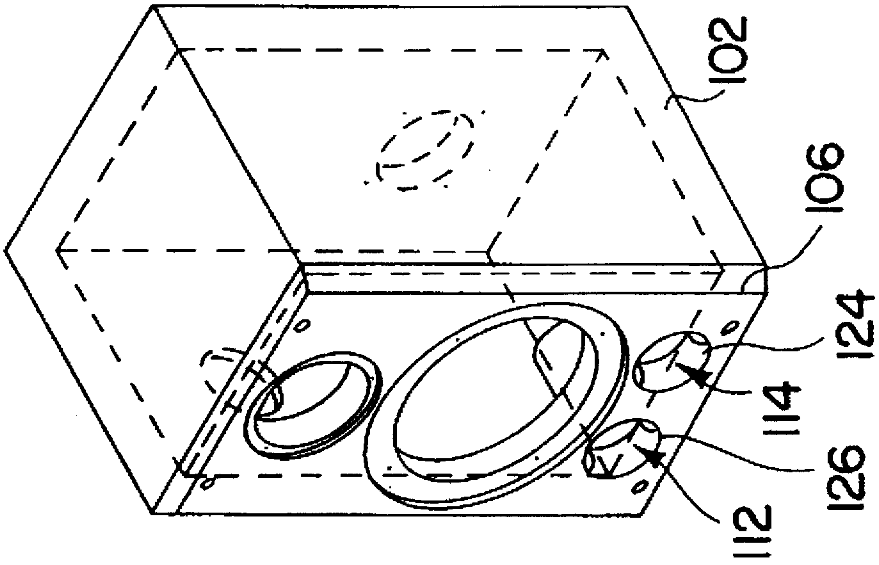
FIG. 3 is a perspective view of various of the components shown in FIG. 2 in an assembled fashion.
Figure 3B:
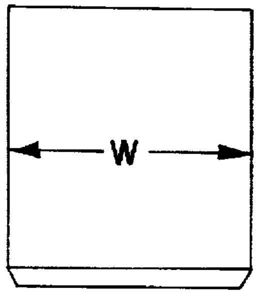
FIG. 3B is a top view of the loudspeaker shown in FIG. 3.

With reference to FIG. 3, as assembled, cabinet 102 exhibits a generally rectangular configuration. With specific reference to FIGS. 3A and 3B, the present invention has been found to be particularly useful in connection with cabinets having internal depth (d) dimensions with a range of about 6 to about 12 inches, corresponding to outer cabinet depth dimensions in the range of about 8 to about 14 inches. While the height and width dimensions of cabinet 102 are not particularly material in the context of the present invention, preferably cabinets having height dimensions in the range of about 12.5 to about 19 inches and width dimensions in the range of about 7.25 to about 9.5 inches are preferred.

In general, and as will be appreciated by those skilled in the art, width and height mode radiations generally can be effectively controlled through appropriate placement of the drive elements. Specifically, excitation of the modes corresponding to the width and height of the cabinet can be appropriately avoided through appropriate spatial location of the drive elements. In accordance with a preferred aspect of the present invention, the woofer and tweeter are suitably located such that such modes are not measurably excited.

While it should be appreciated that the present invention is suitable for speaker systems contained in a wide variety of cabinet configurations and dimensions, in general, the present invention is most advantageously employed in connection with cabinets having depth dimensions in excess of about 6 inches. While the present invention can be utilized in connection with cabinets having smaller dimensions, in general the depth mode frequency of cabinets so dimensioned generally can be effectively eliminated through utilization of passive means, as described hereinabove.

While not necessary in connection with many of the designs contemplated by the present invention, passive dissipative materials may be used in conjunction with ports 116 and 118 to further suppress undesirable resonance within cabinet 102.

Figure 4:
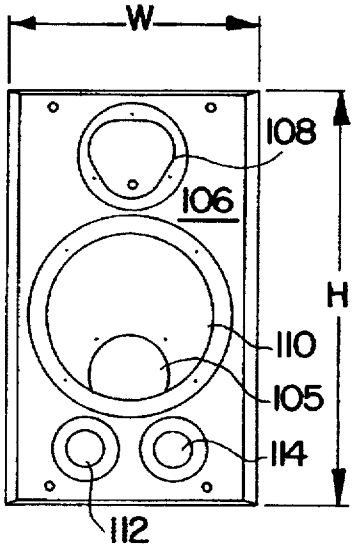
FIG. 4 is a front view of the loudspeaker shown in FIG. 3.

With continued references to FIGS. 2–4, ports 116 and 118 are suitably dimensioned and placed in relationship to the driver (e.g. the woofer) of system 100 such that the effect on total speaker output occasioned by the half-wavelength cabinet depth mode is substantially eliminated. As briefly noted above, while careful placement of the drive unit upon the baffle can prevent excitation and re-radiation of the modes associated with both the height and width dimensions of cabinet 102, because the drive unit must necessarily be mounted to the baffle itself, the half-wavelength resonance associated with depth cannot be avoided.

In accordance with the present invention, ports 116 and 118 each terminate at baffle 106 in proximity to the driver (e.g., woofer). Preferably, and as shown best in FIG. 2, port 116 suitably evidences a length $L_1$. Similarly, port 118 suitably evidences a length $L_2$. Preferably, and as is shown best in FIG. 2, the length $L_1$ is longer than the length $L_2$. In such configuration, port 116 suitably functions as a canceling source at the depth mode frequency as well as a helmholtz low frequency resonator. Preferably, port 118 in conjunction with port 166 function to appropriately tune system 100.

In accordance with a preferred aspect of the present invention, the dimensions of ports 116 and 118 are suitably selected such that objective frequency responses demonstrate diminution of the half wavelength depth mode resonance and subjective response of mid-range clarity and openness is enhanced. Preferably, the length $L_1$ of port 116 is suitably selected to have a predetermined length. For example, and in accordance with the preferred aspect of the present invention, length $L_1$ is selected to be comparable to the internal depth of the cabinet less an appropriate end adjustment. Preferably such end adjustment corresponds to a dimension on the order of the dimension of the diameter $A_1$ of tube 120. Moreover, conventional port adjustment techniques taking into consideration the fact that the acoustic length of the pipe is longer than its physical length can also be employed. For example, for a cabinet 102 having a internal depth dimension d on the order of about 6 inches, the length $L_1$ of port 116 may be suitably selected to be on the order of about 4.5 to about 5 inches for a tube evidencing a diameter on the order of 1 inch.

With known dimensions of cabinet 102, the frequency at which the depth mode exists can be approximated as being substantially equivalent to the resonant frequency for pipes closed at both ends. For purposes of selecting the desired low frequency box resonance through use of conventional electro-acoustical reference data, an approximate overall port dimension to ensure a desired resonance frequency for an enclosure of a specific volume can be readily determined. Once so determined, the overall port dimension can be compared with the predetermined length $L_1$ thus giving any approximate estimation of the length $L_2$ of port 118. For example, porting data for vented loudspeaker enclosures available from Electroacoustical Reference Data, John M. Eargle, Van Nostran Reinhold 1994, Section 68, and in particular Figure 68 provided at page 139 thereof may be utilized for this purpose. The subject matter set forth in Electroacoustical Reference Data is incorporated herein by reference.

More particularly, and in accordance with a preferred aspect of the present invention, one of ports 116, 118, for example the longer port 116, is selected such that it is appropriately dimensioned to have a half-wavelength resonance mode which generally coincides with the half-wavelength depth mode of the cabinet. As will be appreciated, the cabinet depth mode fundamental resonance can be expressed in the terms of the following relationship:

$$F_0=C/\lambda$$

where C is the speed of sound in air (e.g. about 1100 feet/second) and $\lambda$ is the acoustic wavelength. At the fundamental mode, $\lambda$ is generally twice the internal depth of cabinet 102 (e.g. $\lambda$=2d). Thus, knowing the internal depth d of cabinet 102, one can readily arrive at the cabinet depth mode fundamental resonance $F_0$. Dissipative materials can slow the sound speed inside the cabinet giving rise to a lower $F_0$ than would be calculated from this formula.

In accordance with this aspect of the present invention, the length $L_1$ of port 116 is suitably selected such that port 118 will evidence a one half-wavelength "organ pipe" mode which coincides with the cabinet depth mode. Taking into account that the "acoustic" length of port 118 is somewhat longer than its actual length, by about a factor of 1.2×R, where R is the radius of tube 120 (e.g. $A_1/2$) the approximate length $L_1$ of port 116 is suitably determined in accordance with the following relationship:

$$L_1=C/F_0-1.2R, \text{ or which translates to } L_1=d-1.2R$$

In accordance with this aspect of the present invention, the length $L_2$ of port 118 is suitably selected to yield low frequency tuning, or "box-resonance", namely the frequency in which masses of air defined by ports 116 and 118 collectively resonate with the enclosure's airspring, for example, between about 30 and about 60 Hz for practical speakers. Generally, the total port length required for achieving the desired box-resonance is determined, at least in part, by the selected starting value for R, i.e. the pipe radius. For practical applications, R can vary between about 0.5 inches and about 1.5 inches. As will be recognized, the equivalent radius of a single port whose cross-sectional area is the same as two ports of radius R can be expressed in accordance with the following formula:

$$R_{eq}=1.414R$$

By calculating $R_{eq}$ together with the box-resonance and known volume, a total port length can be arrived at. Generally, and in accordance with the present invention, total port length is typically on the order of about 1.25 to about 1.75 $L_1$. As will be appreciated, the total port length physically cannot exceed twice the cabinet depth for two port configurations, for in such case the ports cannot physically fit inside enclosure 102. Of course, to the extent the total port length does exceed twice the cabinet depth, additional ports may be utilized or the port diameter appropriately modified to achieve a desired box resonance.

Once approximate dimensions of ports 116 and 118 are determined, the length and diameter dimensions of ports 116 and 118 are refined through subjective and objective testing. In accordance with a particularly preferred aspect of the present invention, objective testing includes obtaining frequency response measurements and/or spectral decay plots. For example, and with reference to FIG. 7, a plot of magnitude vs. frequency can be obtained which demonstrates in accordance with the present invention, a multiple ported system 100 exhibits elimination of the depth mode resonance frequency for a cabinet. The plot of FIG. 7 exhibits the difference between two frequency response curves, one obtained with one of the ports (e.g. port 116) blocked as compared to the frequency response with both ports open. As will be appreciated, by obtaining various frequency response measurements with variously sized ports, optimum dimensions of the ports can be obtained. Moreover, adjustments to port dimensions may be made in accordance with objectionable test results. For example, onset of port noise at too low of a drive level may dictate the use of a larger diameter port, which in turn will likely require increasing the length $L_2$ of port 118. Alternatively, lack of apparent bass may call for a decrease in the length $L_2$ of port 118. In addition, appropriate changes to the length $L_1$ of port 116 can be made to appropriately adjust for non-coincidence of the narrow band notch attributable to port 116's organ pipe mode radiation as compared with the broader peak associated with the cabinet depth mode re-radiation.

In addition, and in accordance with a further preferred aspect of the present invention, the dimensions of ports 116 and 118 can be further modified and adjusted as a result of subjective testing, for example, having samples of listeners evaluate mid-range clarity and openness.

Figure 7:
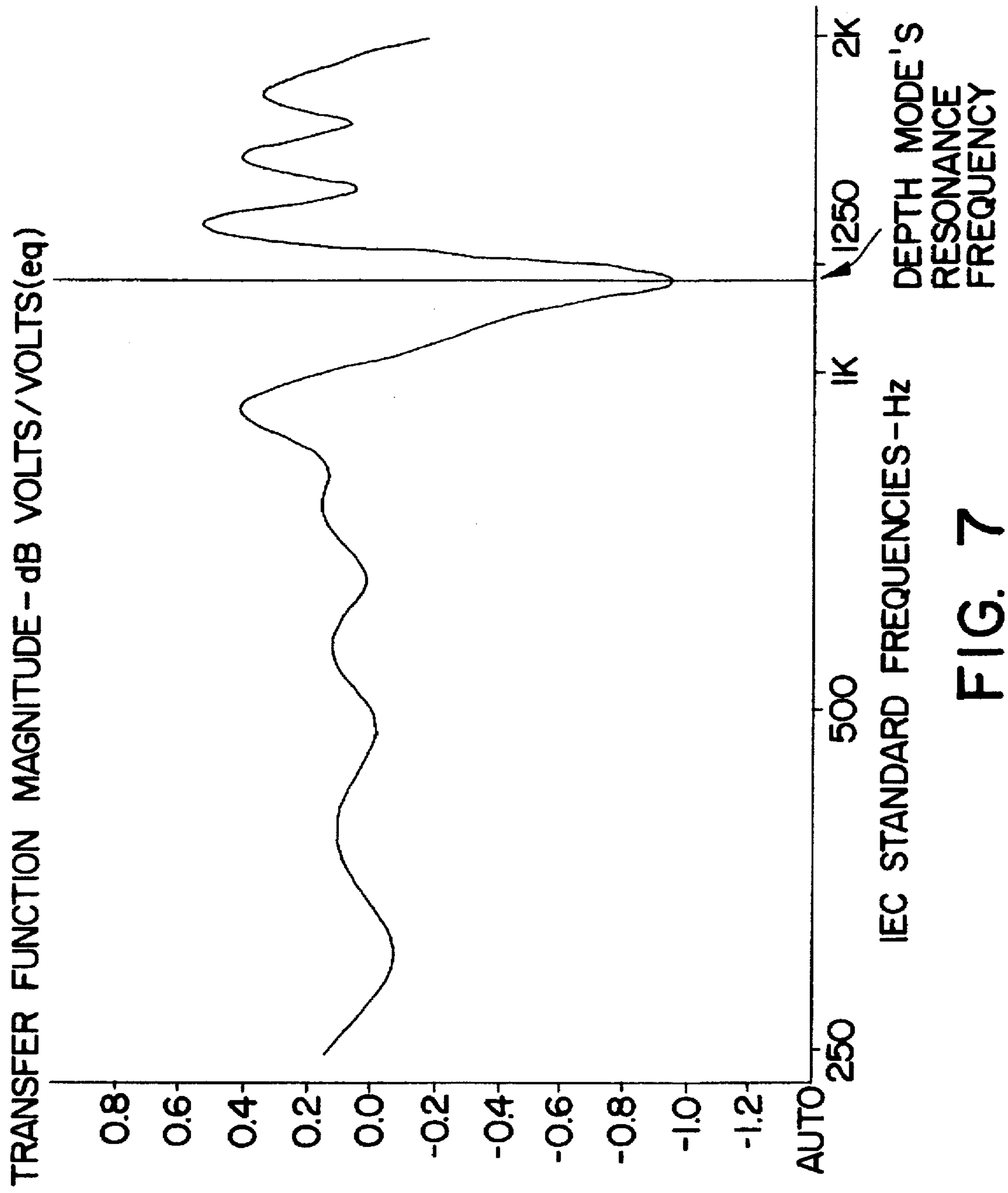
FIG. 7 is a plot of frequency response demonstrating the effectiveness of a loudspeaker made in accordance with the present invention.

Tests conducted with respect to various loudspeaker systems in accordance with the present invention show those systems tend to exhibit acoustic frequency responses, similar to that shown in FIG. 7, where the sound pressure amplitude in the range of the half-wavelength depth mode resonance is depressed, thus giving rise to the surprising level of improvement in mid-range clarity and openness. Free from an annoying coloration (e.g. congestion and lack of openness), that plagues a bass-reflex loudspeaker systems performance when it is conventionally ported, the performance of systems constructed in accordance with the present invention have been found to be preferred in subjective listening tests over conventional bass-reflex loudspeaker systems.

While it should be appreciated that in accordance with the present invention, variously sized cabinets 102 and ports 116 and 118 can be utilized to obtain this surprising and unexpected result, the following Table 1 identifies preferred exemplary embodiments of the present invention. In Table 1 the dimensions for overall cabinet size, namely depth D, height H and width W are shown as are the preferred dimensions of long port 116 ($A_1$, $L_1$) and shorter port 118 ($A_2$, $L_2$).

TABLE 1

| | H | W | D | $L_1$ | $A_1$ | $L_2$ | $A_2$ |
|---|---|---|---|---|---|---|---|
| EX 1 | 12.51 | 7.26 | 8.445 | 6.125 | 1.375 | 4.375 | 1.375 |
| EX 2 | 14.51 | 8.51 | 9.695 | 5.5 | 1.375 | 4.75 | 1.375 |
| EX 3 | 19.01 | 9.51 | 11.195 | 7.0 | 1.597 | 3.5 | 1.597 |

In general, for cabinets having depth dimensions on the order of between about 6 to about 10 inches, the length $L_1$ of port 116 is on the order of about 6 to about 7 inches evidencing a diameter $A_1$ on the order of about 1.3 to about 1.6 inches and the length $L_2$ of port 118 is on the order of about 3.5 to about 4.5 inches evidencing a diameter of about 1.3 to about 1.6 inches.

With reference to FIGS. 3 and 4, apertures 112 and 114 into which ports 116 and 118 are suitably provided are placed adjacent aperture 110 over which a driver (e.g. woofer) is positioned. In general, ports 116 and 118 are placed as close as possible to the driver; typically the edge to edge distance between apertures 112 and 114 and aperture 110 is on the order of about 0.25 to about 1.0 inches, optimally about 0.25 inches.

Figure 5:
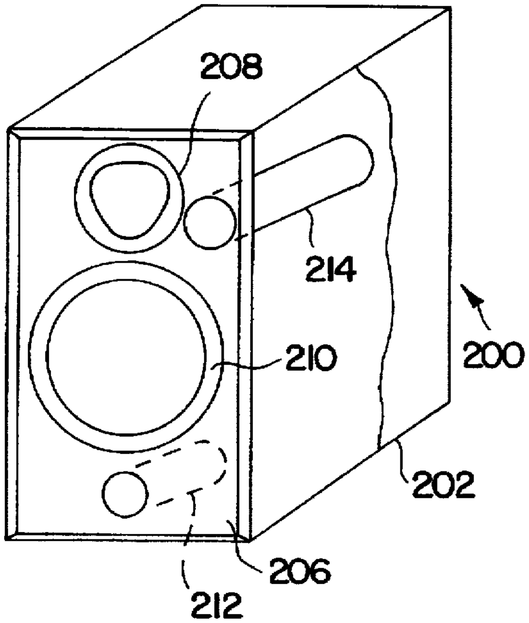
FIG. 5 is an alternative embodiment of a bass-reflex loudspeaker in accordance with the present invention.

While it is desirable to include at least one long port, such as port 116, such is not a requirement of the present invention. In those cases where such a port is employed and is appropriately positioned near the bottom of cabinet 102, port 118 also suitably enhances the low end response of the system in a conventional fashion. Nevertheless, with reference to FIGS. 5 and 6, various other port configurations in accordance with the present invention are shown. For example, system 200, shown in FIG. 5, includes a cabinet 202 into which respective apertures 208, 210 are placed for housing appropriate driver units (not shown). Respective ports 212, 214 appropriately sized and dimensioned to achieve the benefits of the invention as described herein, are suitably placed to terminate at the front baffle 206. In contradistinction to the port configuration shown in connection with System 100, in connection with this embodiment of the present invention, a port 214 is suitably placed in the region between apertures 208 (for example, where a tweeter may be mounted) and aperture 210 (for example, where a woofer may be mounted). In addition, port 212 is suitably placed near the bottom of cabinet 202.

Figure 6:
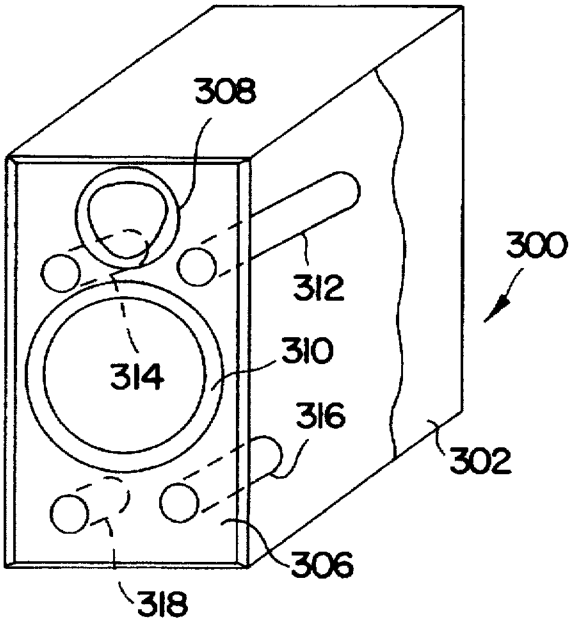
FIG. 6 is a further embodiment of a bass-reflex loudspeaker in accordance with the present invention.

With reference to FIG. 6, system 300 suitably includes a cabinet 302 into which respective apertures 308, 310 are formed for appropriate mounting of driver units (not shown). In accordance with this embodiment, multiple ports namely ports 312, 314, 316 and 318 are suitably placed to terminate at the front baffle 306 and are spaced appropriately about the driver units. As shown, ports 312, 314, 316 and 318 are of various length dimensions. Preferably, each of these ports will evidence a similar diameter dimension; however, varying diameter dimensions may also be employed. There is some advantage to varying the diameter as this allows adjusting the "Q" of the ports' resonances, thereby varying the bandwidth of their cancelling radiation.

It should be understood that the foregoing description relates to preferred exemplary embodiments of the invention, and that the invention is not limited to the specific forms shown herein. Various modifications may be made in the design and arrangement of the elements set forth herein without departing from the scope of the invention as expressed in the appended claims. For example, the number and configuration of the various multiple ports used in connection with the present invention as well as their specific placement within the loudspeaker cabinet may be modified so long as their configuration and placement suitably suppress the effect of the cabinet half-wavelength depth mode on total loudspeaker output. These and other modifications in the design, arrangement and application of the present invention as now known or hereafter devised by those skilled in the art are contemplated by the amended claims.

I claim:

1. An improved bass-reflex loudspeaker system comprising:
   - a cabinet having a front baffle, a rear baffle, and an interior depth measured from said front baffle to said rear baffle, said cabinet having acoustic modal re-radiation during use;
   - a driver unit mounted in said front baffle;
   - a first port terminating at said front baffle, said first port having a first length $L_1$ dependent upon said interior depth of said cabinet and a longitudinal cross sectional dimension A; and
   - a second port terminating at said front baffle, said second port having a second length $L_2$ dependent upon said interior depth of said cabinet and a longitudinal cross sectional dimension approximately equal to said longitudinal cross sectional dimension A;
   - wherein said first length $L_1$, said second length $L_2$, and said longitudinal cross sectional dimensions A enable said first and second ports to cooperate to substantially reduce acoustic depth mode re-radiation associated with said cabinet during use.

2. A loudspeaker system in accordance with claim 1, wherein said length $L_1$ is greater than said length $L_2$.

3. A loudspeaker system in accordance with claim 1, wherein said length $L_1$ is approximately equal to said interior depth of said cabinet less an end adjustment, said end adjustment being adapted such that a half-wavelength resonance of said first port generally coincides with a half-wavelength depth mode resonance of said cabinet.

4. A loudspeaker system in accordance with claim 3, wherein said end adjustment is approximately equal to said cross sectional dimension A.

5. A loudspeaker system in accordance with claim 1, wherein said first port is positioned in said front baffle adjacent and proximate to said driver unit.

6. A method for making a bass-reflex loudspeaker system comprising the steps of:

constructing a cabinet having front and rear baffles, said cabinet having an interior depth measured from said front baffle to said rear baffle;

mounting a driver unit in said front baffle;

determining a half-wavelength depth resonance of said cabinet associated with said interior depth of said cabinet;

fabricating first and second ports such that a half-wavelength resonance of said first port generally coincides with said half-wavelength depth resonance of said cabinet and wherein said second port is sized to cooperate with said first port to thereby provide low frequency tuning of said loudspeaker system; and mounting said first and second ports within said cabinet such that they terminate at said front baffle.

7. A method in accordance with claim 6, wherein said fabricating step comprises the step of adjusting a first length $L_1$ of said first port and a second length $L_2$ of said second port to thereby reduce acoustic depth mode re-radiation associated with said cabinet during use.

8. A method in accordance with claim 6, further comprising the steps of:

obtaining frequency response measurements of said loudspeaker system during use; and adjusting the dimensions of said first and second ports in accordance with frequency response measurements showing reduction of re-radiation at the depth mode resonance frequency of said cabinet.

9. A method in accordance with claim 6, wherein a cross sectional area of said first port is approximately equal to a corresponding cross sectional area of said second port.

10. A method in accordance with claim 6, wherein:

a first length $L_1$ of said first port is approximately equal to said interior depth of said cabinet less an end adjustment; and said fabricating step comprises the step of selecting said end adjustment such that said half wavelength resonance of said first port generally coincides with said half wavelength depth mode resonance of said cabinet.

11. A method in accordance with claim 6, wherein said first length $L_1$ of said first port is greater than a second length $L_2$ of said second port.

* * * * *